United States Patent
Yang et al.

(10) Patent No.: US 10,985,071 B1
(45) Date of Patent: Apr. 20, 2021

(54) GATE OXIDE FORMING PROCESS

(71) Applicant: UNITED MICROELECTRONICS CORP., Hsin-Chu (TW)

(72) Inventors: Yuan-Cheng Yang, Kaohsiung (TW); Yi-Han Su, Pingtung County (TW); Sheng-Chen Chung, Tainan (TW); Chen-An Kuo, Taoyuan (TW); Chun-Lin Chen, Tainan (TW); Chiu-Te Lee, Hsinchu County (TW); Chih-Chung Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/667,921

(22) Filed: Oct. 30, 2019

(51) Int. Cl.
| | |
|---|---|
| H01L 21/8234 | (2006.01) |
| H01L 21/8249 | (2006.01) |
| H01L 21/8238 | (2006.01) |
| H01L 21/28 | (2006.01) |

(52) U.S. Cl.
CPC ........ *H01L 21/823462* (2013.01); *H01L 21/28185* (2013.01); *H01L 21/8249* (2013.01); *H01L 21/823481* (2013.01); *H01L 21/823857* (2013.01)

(58) Field of Classification Search
CPC ..... H01L 21/823462; H01L 21/823481; H01L 21/8249; H01L 21/28185; H01L 21/823857
See application file for complete search history.

(56) References Cited

U.S. PATENT DOCUMENTS

| 6,124,171 | A | 9/2000 | Arghavani |
| 6,262,455 | B1 | 7/2001 | Lutze |
| 6,303,524 | B1 * | 10/2001 | Sharangpani ..... H01L 21/02282 438/780 |
| 6,806,148 | B1 * | 10/2004 | Choi ..................... H01L 27/105 257/E21.689 |
| 2005/0118764 | A1 | 6/2005 | Chou |

* cited by examiner

*Primary Examiner* — Feifei Yeung Lopez
(74) *Attorney, Agent, or Firm* — Winston Hsu

(57) ABSTRACT

A gate oxide forming process includes the following steps. A substrate including a first area and a second area is provided. A first oxide layer, a silicon containing cap layer and a second oxide layer on the substrate of the first area and the second area are sequentially and blanketly formed. The silicon containing cap layer and the second oxide layer in the first area are removed. An oxidation process is performed to oxidize the silicon containing cap layer and a gate oxide layer is formed in the second area.

14 Claims, 5 Drawing Sheets

US 10,985,071 B1

GATE OXIDE FORMING PROCESS

BACKGROUND OF THE INVENTION

1. Field of the Invention

The present invention relates generally to a gate oxide forming process, and more specifically to a gate oxide forming process in different areas.

2. Description of the Prior Art

In integrated circuits, applied voltage to transistors in a high voltage component area is much higher than the applied voltage to transistors in a logic circuit area. Thus, thicknesses of buffer layers or dielectric layers of the transistors in the high voltage component area should be larger than the thicknesses of buffer layers or dielectric layers of the transistors in the logic circuit area.

Fabricating transistors in the high voltage component area and in the logic circuit area includes the following steps. A thick oxide layer suited for usage in transistors in the high voltage component area is formed on a substrate in the high voltage component area and in the logic circuit area. Then, the thick oxide layer in the logic circuit area is removed and a thinner oxide layer suited for usage in transistors in the logic circuit area is formed to replace the thick oxide layer. After the thick oxide layer is formed in the high voltage component area and the thinner oxide layer is formed in the logic circuit area, a polysilicon layer is formed on the oxide layer in the two areas at the same time. Thereafter, the polysilicon layer, the thick oxide layer and the thinner oxide layer are sequentially patterned. Sequential transistor processes are then performed.

SUMMARY OF THE INVENTION

The present invention provides a gate oxide forming process, which integrates devices of two different voltage areas without extra thermal budget impact.

The present invention provides a gate oxide forming process including the following steps. A substrate including a first area and a second area is provided. A first oxide layer, a silicon containing cap layer and a second oxide layer on the substrate of the first area and the second area are sequentially and blanketly formed. The silicon containing cap layer and the second oxide layer in the first area are removed. An oxidation process is performed to oxidize the silicon containing cap layer and a gate oxide layer is therefore formed in the second area.

According to the above, the present invention provides a gate oxide forming process, which sequentially and blanketly forms a first oxide layer, a silicon containing cap layer and a second oxide layer on a substrate of a first area and a second area; removes the silicon containing cap layer and the second oxide layer in the first area; and performs an oxidation process to oxidize the silicon containing cap layer and thus forms a gate oxide layer in the second area. Thereby, gate oxide layers with different thicknesses in the first area and the second area can be formed. By using the method of the present invention, devices in the second area can be integrated with devices in the first area without extra thermal budget impact, and the uniformity of the breakdown voltage of a formed device can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIG. 1 schematically depicts a cross-sectional view of a gate oxide forming process according to an embodiment of the present invention.
Figure 1:
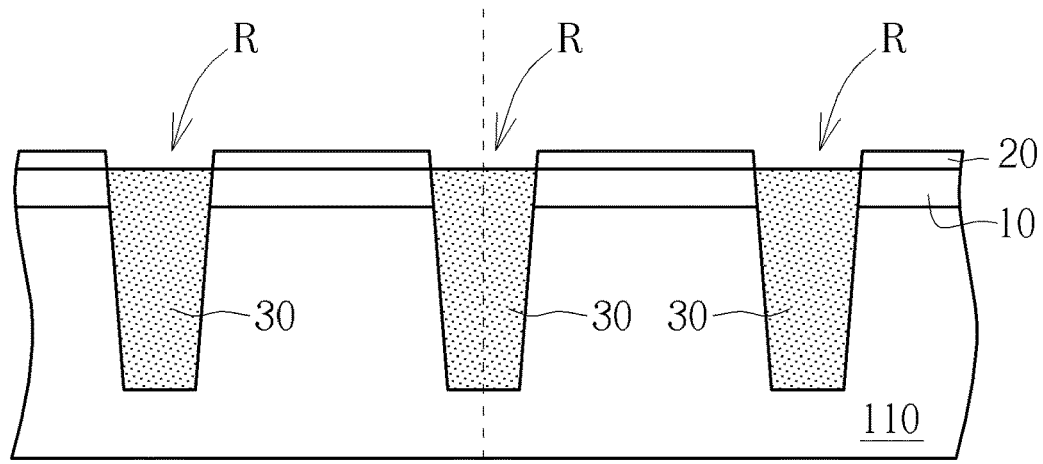

FIGS. 1-9 schematically depict cross-sectional views of a gate oxide forming process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers etc. The substrate 110 may include a first area A and a second area B, but it is not limited thereto. The substrate 110 may further include other areas (not shown). In this embodiment, the first area A is a low voltage area while the second area B is a medium voltage area, so that the thickness of a gate oxide layer on the substrate 110 of the first area A is thinner than the thickness of a gate oxide layer on the substrate 110 of the second area B. The method of the present invention described as follows can be applied in a bipolar-CMOS-DMOS (BCD) process or other processes of multiple voltage areas.

Isolation structures 30 may be formed in the substrate 110. The isolation structures 30 may be shallow trench isolation structures, which may be formed by a shallow trench isolation process, but it is not limited thereto. Methods of forming the isolation structures 30 may include the following. A first oxide layer (not shown) and a nitride layer (not shown) may be sequentially formed on the substrate 110 of the first area A and the second area B. The first oxide layer (not shown) and the nitride layer (not shown) may be deposited by atomic layer deposition (ALD) processes or chemical vapor deposition (CVD) processes, but it is not restricted thereto. The first oxide layer (not shown), the nitride layer (not shown) and the substrate 110 are etched to form recesses R in a first oxide layer 10, a nitride layer 20 and the substrate 110. The isolation structures 30 fill in the recesses R.

Figure 2:
FIG. 2 schematically depicts a cross-sectional view of a gate oxide forming process according to an embodiment of the present invention.
Figure 2:
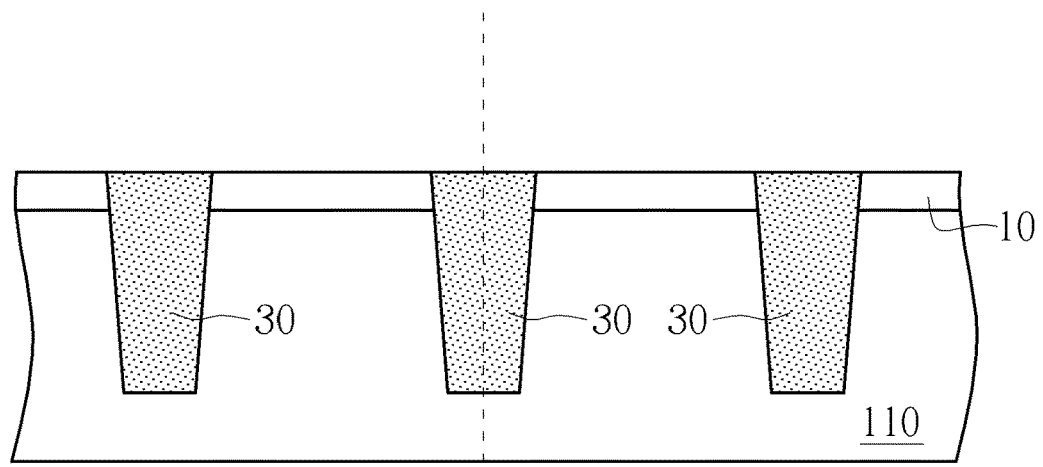

Then, the nitride layer 20 is removed, as shown in FIG. 2. In this embodiment, the first oxide layer 10 is a pad oxide layer for forming the isolation structures 30. In other embodiments, the first oxide layer 10 may be formed blanketly after the isolation structures 30 are carried out. For example, the thickness of the first oxide layer 10 is 110 angstroms.

Figure 3:
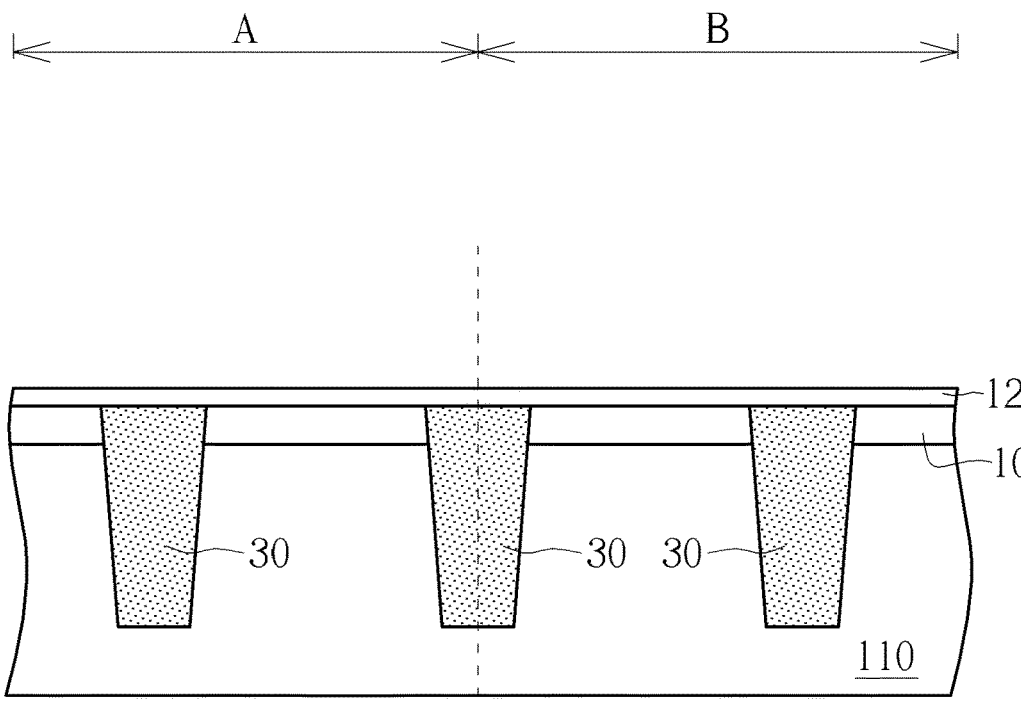
FIG. 3 schematically depicts a cross-sectional view of a gate oxide forming process according to an embodiment of the present invention.

As shown in FIG. 3, a silicon containing cap layer 120 is formed on the substrate 110 of the first area A and the second area B blanketly. The silicon containing cap layer 120 may include a silicon layer, a polysilicon layer or etc. The silicon containing cap layer 120 may be deposited by an atomic layer deposition (ALD) processes or a chemical vapor deposition (CVD) process, but it is not restricted thereto. For example, the thickness of the silicon containing cap layer 120 is 10-20 angstroms.

Figure 4:
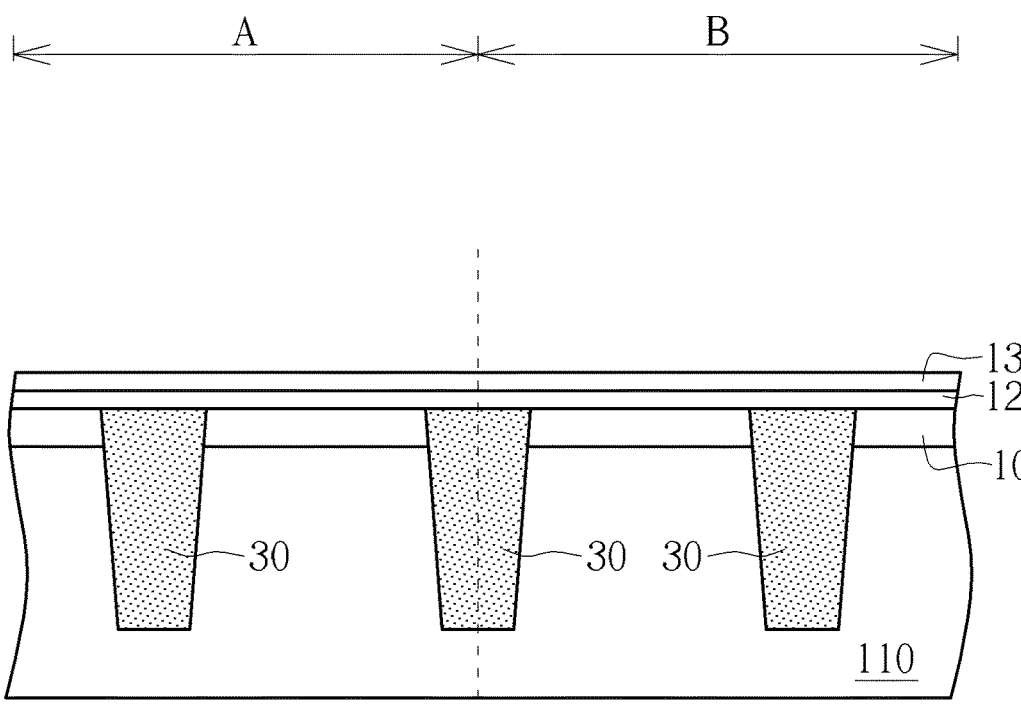
FIG. 4 schematically depicts a cross-sectional view of a gate oxide forming process according to an embodiment of the present invention.

As shown in FIG. 4, a second oxide layer 130 is formed on the silicon containing cap layer 120 of the first area A and the second area B blanketly. The second oxide layer 130 may be deposited by an atomic layer deposition (ALD) processes or a chemical vapor deposition (CVD) process, but it is not restricted thereto. For example, the thickness of the second oxide layer 130 is 15-20 angstroms.

Figure 5:
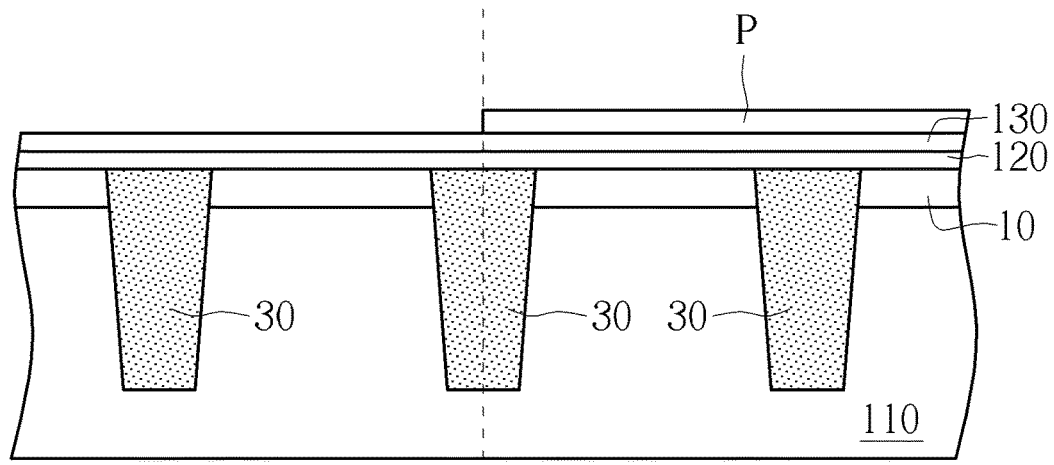
FIG. 5 schematically depicts a cross-sectional view of a gate oxide forming process according to an embodiment of the present invention.
Figure 6:
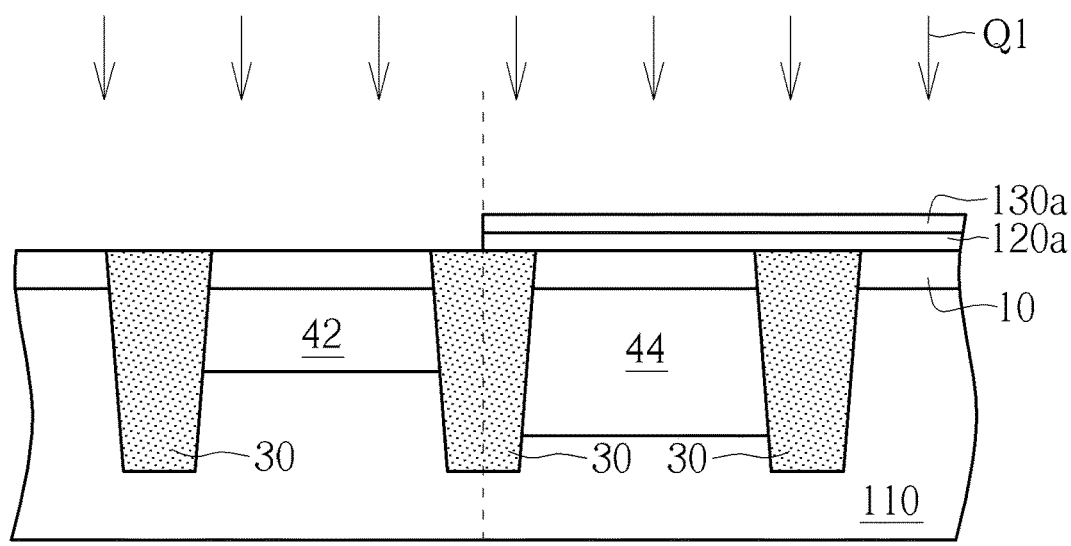
FIG. 6 schematically depicts a cross-sectional view of a gate oxide forming process according to an embodiment of the present invention.

Please refer to FIGS. 5-6, the second oxide layer 130 and the silicon containing cap layer 120 are removed only in the first area A, and the second oxide layer 130 and the silicon containing cap layer 120 are reserved in the second area B. As shown in FIG. 5, a photoresist P may be formed by coating and then patterning to cover the second oxide layer 130 of the second area B but exposes the second oxide layer 130 of the first area A. Thereafter, the silicon containing cap layer 120 and the second oxide layer 130 in the first area A are removed, and thus a silicon containing cap layer 120a and a second oxide layer 130a only in the second area B are formed, and the first oxide layer 10 in the first area A is exposed, as shown in FIG. 6. The photoresist P is then removed.

A first well 42 is formed on the substrate 110 of the first area A, and a second well 44 is formed on the substrate 110 of the second area B. The first well 42 and the second well 44 may be formed on the substrate 110 of the first area A and the second area B respectively by different implant processes. Due to the first oxide layer 10 covering the substrate 110 of the first area A and the first oxide layer 10, the silicon containing cap layer 120a and the second oxide layer 130a covering the substrate 110 of the second area B, the substrate 110 can be prevented from damage and the performance of the first well 42 and the second well 44 is improved. Then, a thermal process Q1 may be performed to active the first well 42 and the second well 44. The thermal process Q1 may be a rapid thermal processing (RTP) process, but it is not limited thereto.

Figure 7:
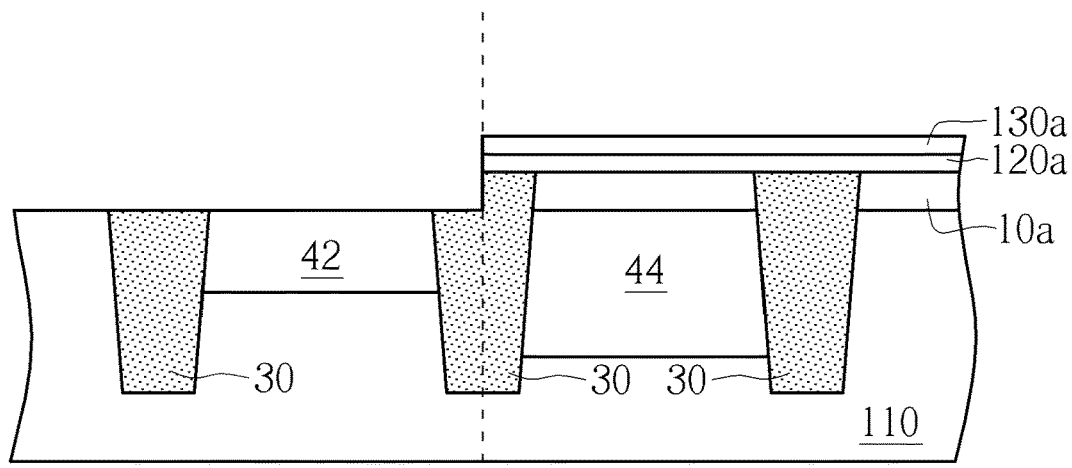
FIG. 7 schematically depicts a cross-sectional view of a gate oxide forming process according to an embodiment of the present invention.

Thereafter, the first oxide layer 10 in the first area A is removed after the first well 42 and the second well 44 are formed, thereby a first oxide layer 10a only on the substrate 110 of the second area B being formed and the substrate 110 in the first area A being exposed, as shown in FIG. 7.

Figure 8:
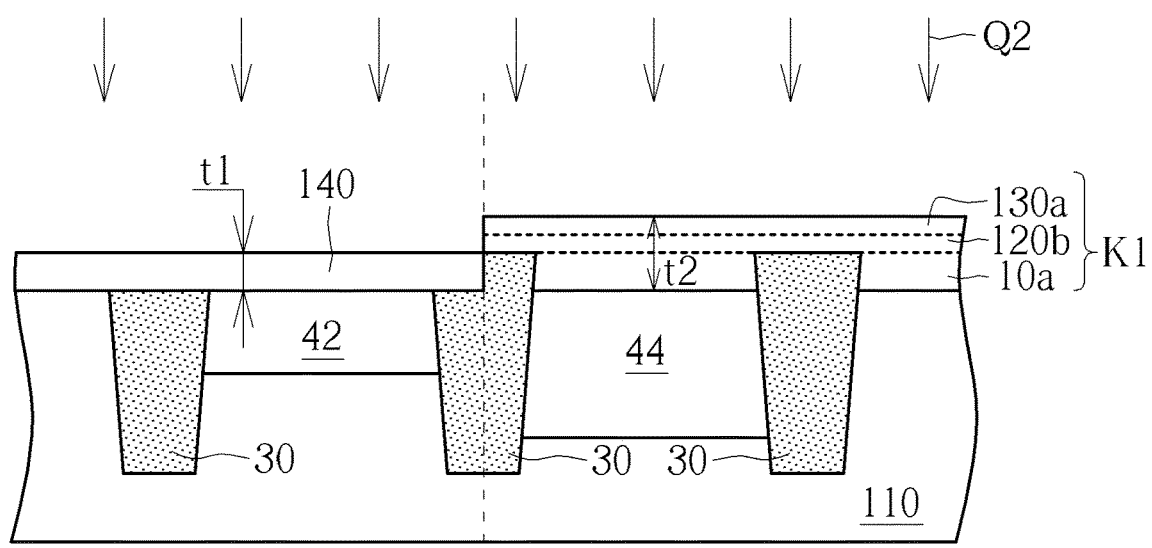
FIG. 8 schematically depicts a cross-sectional view of a gate oxide forming process according to an embodiment of the present invention.

Please refer to FIGS. 7-8, a first gate oxide layer 140 is formed on the substrate 110 of the first area A and a gate oxide layer K1 is formed on the substrate 110 of the second area B. In this embodiment, an oxidation process Q2 is performed to not only form the first gate oxide layer 140 on the substrate 110 of the first area A, but also oxidize the silicon containing cap layer 120a on the substrate 110 of the second area B, therefore forming the gate oxide layer K1 in the second area B, wherein the gate oxide layer K1 is constituted by the first oxide layer 10 in the second area B, a silicon oxide layer 120b transferring from the silicon containing cap layer 120a and the second oxide layer 130a. Preferably, the oxidation process is a rapid thermal oxide (RTO) process, but it is not limited thereto. Since the first area A is a low voltage area while the second area B is a medium voltage area in this case, a thickness t1 of the first gate oxide layer 140 on the substrate 110 of the first area A is thinner than a thickness t2 of the gate oxide layer K1 on the substrate 110 of the second area B. By doing this, only one photoresist P is applied and one oxidation process Q2 is processed to form the first gate oxide layer 140 in first area A and the gate oxide layer K1 in the second area B. Thus, devices in the second area B (meaning the medium voltage area in this case) can be integrated with devices in the first area A (meaning the low voltage area in this case) without extra thermal budget impact, hence keeping the performance of the devices in the low voltage area. Besides, the thickness t2 of the gate oxide layer K1 is tunable, and the first oxide layer 10 in the second area B can be prevented from damage because of the coverage of the silicon containing cap layer 120a. As a result, the uniformity of the breakdown voltage of a formed device can be improved.

Figure 9:
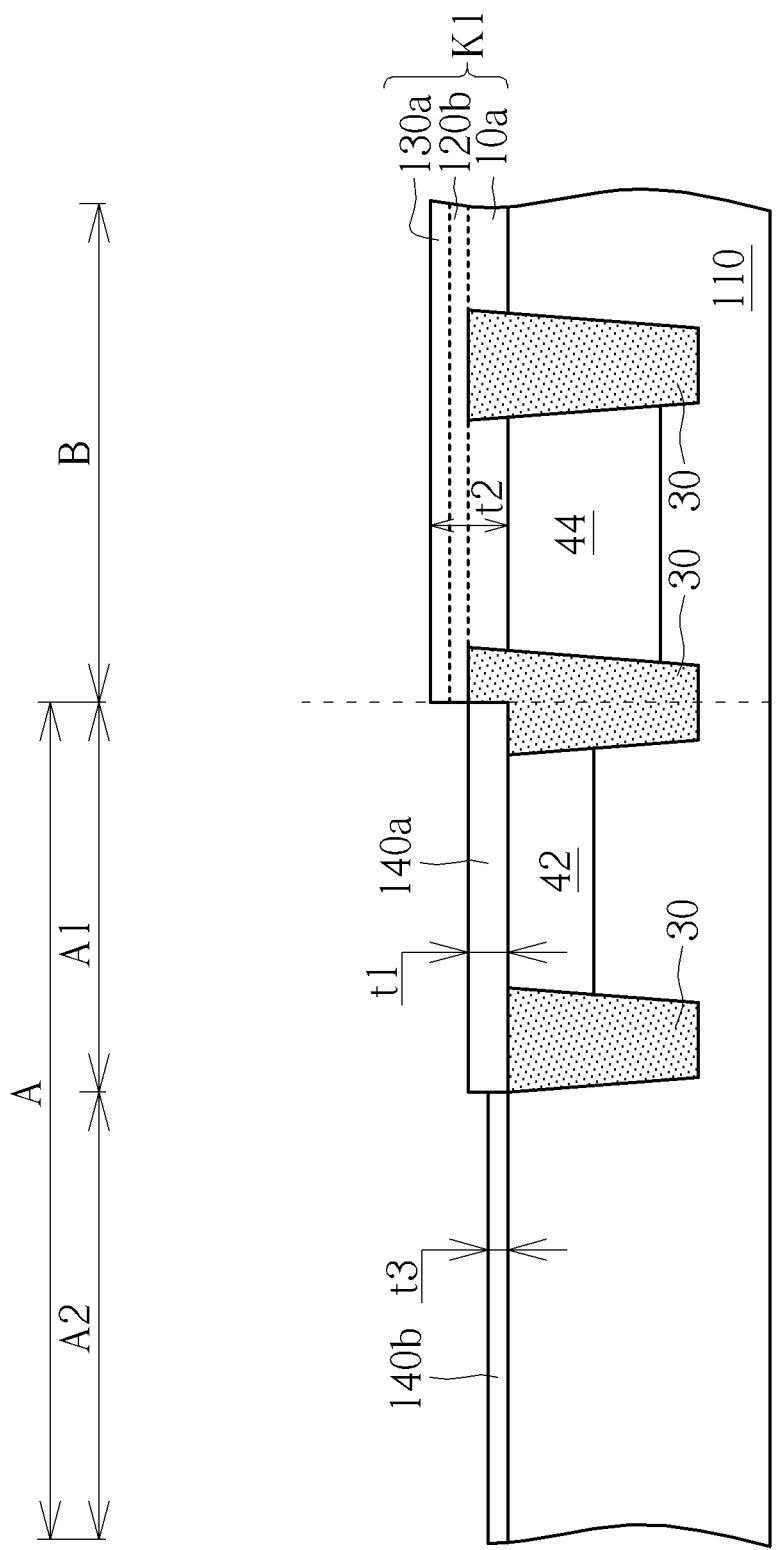
FIG. 9 schematically depicts a cross-sectional view of a gate oxide forming process according to an embodiment of the present invention.

In one case, the first area A may include an input/output area A1 and a logic area A2, as shown in FIG. 9. The first gate oxide layer 140 of FIG. 8 is an input/output gate oxide layer, so that the first gate oxide layer 140 in the logic area A2 is removed to expose the substrate 110 while a first gate oxide layer 140a in the input/output area A1 is reserved. Then, a second gate oxide layer 140b is formed on the substrate 110 of the logic area A2. A thickness t3 of the second gate oxide layer 140b is thinner than the thickness t1 of the first gate oxide layer 140a.

In later processes, polysilicon gates may be disposed over the gate oxide layer K1 in the second area B, the first gate oxide layer 140a in the input/output area A1 and the second gate oxide layer 140b in the logic area A2 at the same time or respectively.

To summarize, the present invention provides a gate oxide forming process, which sequentially and blanketly forms a first oxide layer, a silicon containing cap layer and a second oxide layer on a substrate of a first area and a second area; removes the silicon containing cap layer and the second oxide layer in the first area; and performs an oxidation process to oxidize the silicon containing cap layer and therefore forms a gate oxide layer in the second area. Thereby, gate oxide layers with different thicknesses in the first area and the second area can be formed. By using the method of the present invention, devices in the second area can be integrated with devices in the first area A without extra thermal budget impact, the performance of the devices in the low voltage area can be kept, and the uniformity of the breakdown voltage of a formed device can be improved.

Moreover, the first oxide layer in the first area may be removed before the oxidation process is performed, so that a gate oxide layer on the substrate of the first area can be formed while the oxidation process is performed. A first well may be formed in the substrate of the first area and a second well may be formed in the substrate of the second area before the first oxide layer is removed, thereby the substrate can being prevented from damage while implanting.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A gate oxide forming process, comprising:
   providing a substrate comprising a first area and a second area;
   sequentially and blanketly forming a first oxide layer, a silicon containing cap layer and a second oxide layer on the substrate of the first area and the second area;
   removing the silicon containing cap layer and the second oxide layer in the first area; and
   performing an oxidation process to oxidize the silicon containing cap layer completely and thus forming a gate oxide layer in the second area.

2. The gate oxide forming process according to claim 1, wherein the first area is a low voltage area while the second area is a medium voltage area.

3. The gate oxide forming process according to claim 1, wherein the silicon containing cap layer comprises a silicon layer or a polysilicon layer.

4. The gate oxide forming process according to claim 1, wherein the oxidation process comprises a rapid thermal oxide process.

5. The gate oxide forming process according to claim 1, wherein the steps of removing the silicon containing cap layer and the second oxide layer in the first area comprise:
   forming a photoresist covering the second oxide layer of the second area but exposing the second oxide layer of the first area; and
   removing the silicon containing cap layer and the second oxide layer in the first area; and
   removing the photoresist.

6. The gate oxide forming process according to claim 1, further comprising:
   forming a first well in the substrate of the first area, and a second well in the substrate of the second area before the oxidation process is performed.

7. The gate oxide forming process according to claim 6, wherein the first well and the second well are both formed by performing an implantation process and then a thermal process.

8. The gate oxide forming process according to claim 7, wherein the thermal process comprises a rapid thermal processing (RTP) process.

9. The gate oxide forming process according to claim 6, further comprising:
   removing the first oxide layer in the first area after the first well and the second well are formed; and
   forming a first gate oxide layer on the substrate of the first area.

10. The gate oxide forming process according to claim 9, wherein the first gate oxide layer is formed by performing the oxidation process.

11. The gate oxide forming process according to claim 10, wherein the first gate oxide layer is an input/output gate oxide layer in an input/output area.

12. The gate oxide forming process according to claim 11, further comprising:
    forming a second gate oxide layer in a logic area.

13. The gate oxide forming process according to claim 1, further comprising:
    forming an isolation structure in the substrate before the silicon containing cap layer and the second oxide layer are formed.

14. The gate oxide forming process according to claim 13, wherein the steps of forming the isolation structure comprise:
    sequentially forming the first oxide layer and a nitride layer on the substrate;
    etching the first oxide layer, the nitride layer and the substrate to form a recess;
    forming the isolation structure in the recess; and
    removing the nitride layer.

* * * * *